United States Patent [19]
Wetzel et al.

[11] Patent Number: 5,920,790
[45] Date of Patent: Jul. 6, 1999

[54] METHOD OF FORMING A SEMICONDUCTOR DEVICE HAVING DUAL INLAID STRUCTURE

[75] Inventors: Jeffrey T. Wetzel; John J. Stankus, both of Austin, Tex.

[73] Assignee: Motorola, Inc., Schaumburg, Ill.

[21] Appl. No.: 08/921,293

[22] Filed: Aug. 29, 1997

[51] Int. Cl.⁶ .................................. H01L 21/4763
[52] U.S. Cl. .................. 438/618; 438/622; 438/623; 438/624; 438/627; 438/628; 438/634; 438/638
[58] Field of Search .................... 438/618, 622, 438/623, 624, 627, 628, 634, 638

[56] References Cited

U.S. PATENT DOCUMENTS

| | | | |
|---|---|---|---|
| 4,702,792 | 10/1987 | Chow et al. | 156/628 |
| 4,789,648 | 12/1988 | Chow et al. | 437/225 |
| 4,944,836 | 7/1990 | Beyer et al. | 156/645 |

OTHER PUBLICATIONS

B. Luther et al., "Planar Copper–Polyimide Back End of the Line Interconnections for ULSI Devices", Jun. 8–9, 1993 VMIC Conference, Catalog No. 93ISMIC–102, pp. 15–21.

*Primary Examiner*—John F. Niebling
*Assistant Examiner*—David A. Zarneke

[57] ABSTRACT

A method for forming semiconductor device (1) that includes providing a substrate (10) having a metal interconnect (12), depositing a via interlevel dielectric (ILD) layer (20) over the substrate (10) and the metal interconnect (12), etching the via ILD layer (20) to form a via (30) over the metal interconnect (12), depositing a trench ILD layer (32) over the via ILD layer (12) and the via (30), etching the trench ILD layer (32) to form a trench (40), the trench (40) being contiguous with the via (12), and depositing a metal (44) so as to fill the via (30) and the trench (40), and provide electrical connection with the metal interconnect (12).

26 Claims, 4 Drawing Sheets

METHOD OF FORMING A SEMICONDUCTOR DEVICE HAVING DUAL INLAID STRUCTURE

TECHNICAL FIELD OF THE INVENTION

This invention relates in general to a method for forming semiconductor devices, and more particularly, to a method for forming multilevel metal (MLM) interconnects in semiconductor devices.

BACKGROUND OF THE INVENTION

The present invention is directed to a method of forming a dual inlaid interconnect structure in semiconductor devices, including microprocessors, DSPs, microcontrollers, FSRAMS, etc. Dual inlaid interconnect techniques are generally known in the art, and have been found to be advantageous by permitting simultaneous formation of interconnected, metal-filled trenches and vias. However, numerous problems exist with current dual inlaid technology, particularly with respect to use of such technology with so-called low-k dielectrics, materials having a dielectric constant below 3.5, more preferably, below 3.0. In connection with prior art techniques of forming dual inlaid structures, reference is made to FIG. 9.

FIG. 9 depicts a stage in the method of forming a dual inlaid structure at a step where via opening 400a is formed in trench interlevel dielectric (ILD) layer 320. More particularly, FIG. 9 depicts a structure having substrate 100, formed of a low-k material or a conventional oxide material, in which metallic interconnects 120 are formed. As known in the art, metallic interconnects can be formed of copper, aluminum, gold, silver, etc. Metal interconnects 120 are provided for lower level electrical connection to active devices formed along the active region of the semiconductor substrate (not shown). An etch stop layer 160 is deposited over substrate 100, including metal interconnects 120. Etch stop layer 160 is generally formed of a nitride material, such as silicon nitride, silicon oxynitride, or a composite thereof. Conventionally, the etch stop layer is formed by a plasma enhanced chemical vapor deposition process. Then, a via ILD layer 200 is deposited on the etch stop layer 160. Via ILD layer 200 is generally formed of an oxide, such as silicon dioxide formed by PECVD. Further, etch stop layer 220 is formed on via level dielectric 200, in a similar fashion to etch stop layer 160 formed on substrate 100. Trench level dielectric 320 is then formed on etch stop layer 220, in a similar fashion to the via ILD layer 200.

After completing the dual dielectric layer structure including dielectric layers 200 and 320, etching is executed to form a lower via 400 and a trench 500, both of which are subsequently filled with a conductive metal. Particularly, a hard mask 340 is formed on trench level dielectric 320. The hard mask 340 is be formed in a similar fashion to the etch stop layers 160 and 220. A photoresist 360 is then formed on hard mask 340. The materials of photoresist 360 are particularly chosen depending upon the particular wavelength utilized for exposure, such as I-line or DUV (deep ultraviolet) processing. Such photoresist materials are generally spun-on and are readily commercially available.

FIG. 9 particularly shows a first step for forming what is known in the art as the conventional via first-trench last (VFTL) process, wherein via 400 is formed in the via ILD layer 200 prior to trench 500 within trench ILD layer 320. Here, after exposure and developing of photoresist 360, hard mask 340 is etched, followed by subsequent etching of via opening 400a in the trench ILD layer 320. Thereafter, additional etching steps are carried out to form via 400 and trench 500. Via 400 and trench 500 are formed by any one of several conventional techniques. For example, etch stop layer 220 is etched, followed by partial etching, such as to level 400b, to leave a dielectric material over etch stop layer 160. At this point, photoresist 360 is removed by the etching process, and a new photoresist layer (not shown) is formed to define trench 500. During etching to define trench 500, the remaining portion of dielectric material below level 400b is simultaneously removed.

A final etching step is be executed to remove a portion of etch stop layer 160 superposed on metal interconnect 120, followed by metal fill to fill via 400 and trench 500 and provide electrical connection to metal interconnect 120. While not shown in the plane of FIG. 9, trench 500, after metal fill, forms a line that extends into and out of the plane to provide electrical contact to the other in trenches and vias. The vias, on the other hand, only provide electrical connection vertically through the structure, to the contacts 120. Accordingly, the vias generally extend perpendicularly with respect to the plane of FIG. 9 only a short distance. For example, via 400 may be round or square, the width of the via 400 shown in FIG. 9 defining the diameter or side respectively.

The process as described above in connection with FIG. 9 is known in the art, particularly with respect to via and trench ILD layers formed of an oxide dielectric material. However, the present inventors have recognized several problems with this process when applied to low-k dielectrics for the via and trench ILD layers. Particularly, it has been observed that the materials used for forming the photoresist 360, as well as the developer for such materials, interact with the exposed outer walls within via opening 400a, along zone 320a. In particular, it has been observed that the low-k dielectric material tends to swell due to absorption of solvent used in connection with the photoresist and/or the developer used for forming trench 500. Additionally, unwanted chemical reactions take place between the low-k dielectric material along zone 320a and the photoresist, the solvent used with the photoresist, and/or the developer used for developing the photoresist. As is evident, the swelling of the low-k dielectric material along via opening 400a can be deleterious, causing problems with control of critical dimensions (CD) and ILD stack integrity, resulting in cracking of the hardmask 340, for example. Further, the unwanted chemical reactions may adversely affect the photo-active properties of the photoresist layer for forming trench 500, or the dielectric properties along zone 320a.

Further, multilevel metal (MLM) interconnects may also be made by other techniques, such as utilizing a single inlaid process. In this known process, a single inlaid of metal trace is deposited in the via ILD layer, prior to formation of the trench ILD layer thereon. Accordingly, the metal deposited in the via requires CMP (chemical mechanical polishing) prior to formation of subsequent layers thereon, including appropriate etch stop layers and the trench ILD layer. Not only does this process require multiple steps of depositing metal to fill the vias and trenches, but also multiple CMP steps, which are difficult to regulate and clean-up after.

In view of the foregoing problems with application of the dual inlaid process to low-k dielectric materials, and the disadvantages with single inlaid process, the present invention has been developed.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION OF THE DRAWINGS

Figure 1:
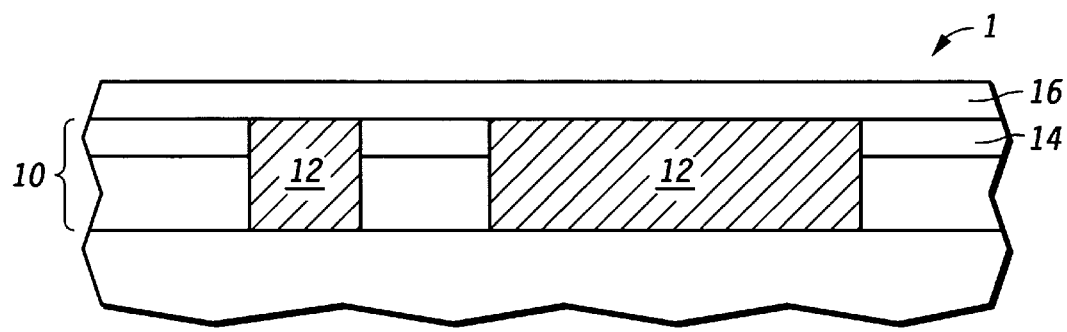
FIG. 1 depicts a step of providing a substrate having metal interconnects therein.

In reference to FIGS. 1–8, the present invention is described herein. FIG. 1 depicts a step of providing a substrate 10 having metal interconnects 12 of semiconductor device 1. The substrate 10 and metal interconnects 12 may be formed of conventional materials. For example, substrate 10 may be formed of an oxide such as $SiO_2$. However, substrate 10 is preferably formed of a low-k dielectric polymer material. The metal interconnects 12 are preferably formed of copper, but may also be formed of aluminum, gold, and silver, for example. In the case of a low-k dielectric material for substrate 10, preferably a polish stop layer 14 is incorporated, which provides an indication to stop polishing the metal interconnects 12 after a metal fill step. The polish stop layer may or may not be consumed during polishing. It is noted that a polish stop layer need not be incorporated in the structure in the case of an oxide substrate, particularly $SiO_2$. Further, a passivation layer 16 is provided so as to cover substrate 10, which includes metal interconnects 12. Passivation layer 16 functions to protect metal interconnects 12 from damage during later processing steps, and also provides an etch stop function during later processing steps. The passivation layer 16 may be formed of silicon nitride, silicon oxynitride, or composites thereof. However, it is noted that a passivation layer need not be incorporated when certain metals are used for metal interconnects, such as aluminum. Particularly, aluminum forms a self-passivating layer formed of aluminum oxide. In contrast, copper does not form an effective passivating layer.

The substrate is on the order of 5,000–12,000 angstroms in thickness, and the passivating layer is generally on the order of 300–1,100 angstroms in thickness. However, preferably, the passivating layer is made as thin as possible to minimize intra-line capacitance, and may be as thin as 10 angstroms. The substrate and passivating layer can be made by conventional techniques, as well known in the art. For example, the passivating layer can be made by chemical vapor deposition or plasma-enhanced chemical vapor deposition.

Figure 2:
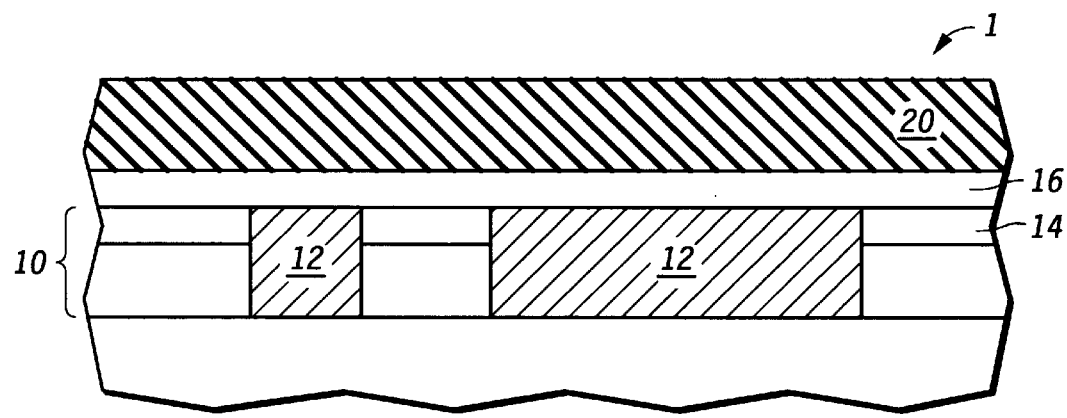
FIG. 2 depicts a step of forming a via interlevel dielectric (ILD) layer on the substrate.

FIG. 2 illustrates a next step of forming a via ILD layer 20. The via ILD layer 20 is preferably formed of low-k organic materials, such as thermoplastics or thermosetting plastics, having a dielectric constant lower than 3.5, preferably lower than 3.0. Examples of thermoplastics include polyimides, polyarylethers, PTFEs, polyquinolines, polyphenylquinoxalines, parylenes, and polynaphthalenes. Examples of thermosetting plastics include benzocyclobutenes, fluorinated amorphous carbons, and polyimides. While particular materials for the via ILD layer 20 are set forth herein, it is understood that other low-k materials may be utilized. The via ILD layer 20 is preferably on the order 1,000 to 20,000 angstoms in thickness, more preferably on the order of 5,000–12,000 angstroms in thickness.

Figure 3:
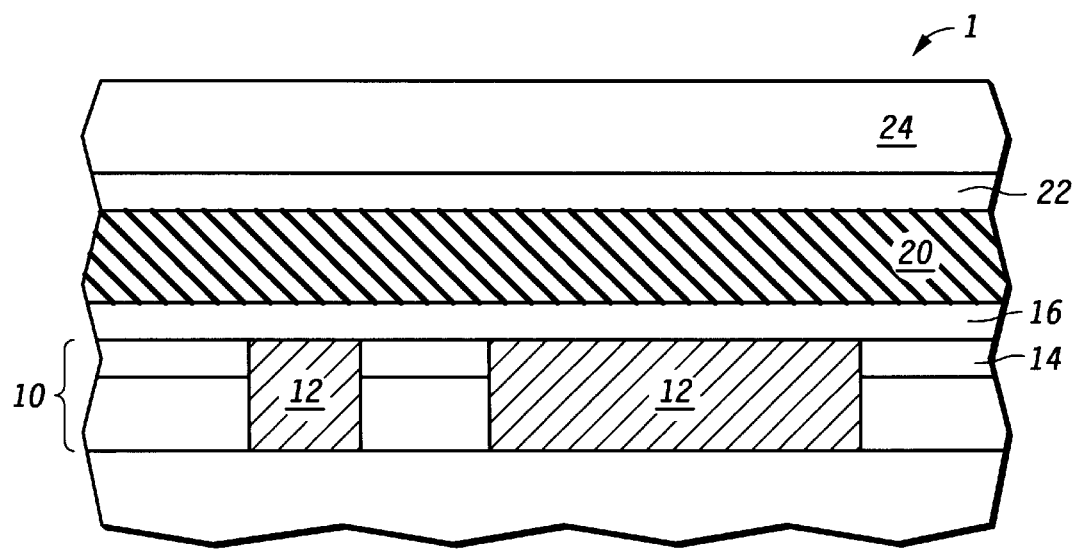
FIG. 3 depicts formation of a mask, including a hard mask and photoresist, on the via ILD layer.

Thereafter, as shown in FIG. 3, a first hard mask 22 is formed along with a first photoresist layer 24. The first hard mask 22 is formed by an inorganic layer comprised of various materials, such as silicon nitride, silicon oxynitride, silicon dioxide, phosphorous-doped silicon dioxide, or composites thereof, similar to the passivating layer 16. While the drawings depict formation of first hard mask 22, this component is not necessarily incorporated for inorganic dielectric materials. However, in the case of an organic low-k dielectrics such as those preferably used for via ILD layer 20, a hard mask is preferably incorporated.

Figure 4:
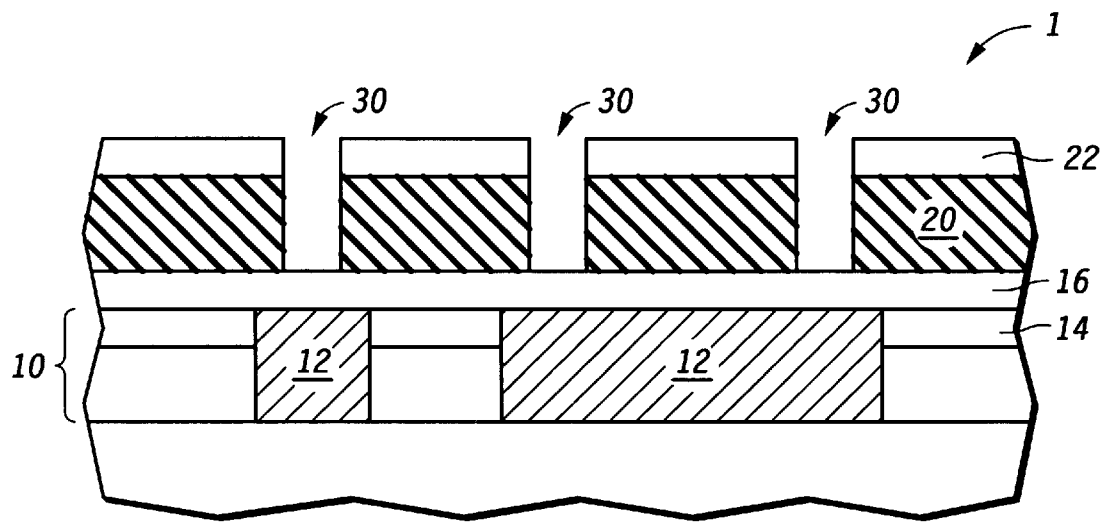
FIG. 4 depicts the structure after etching the via ILD layer to form vias.
Figure 5:
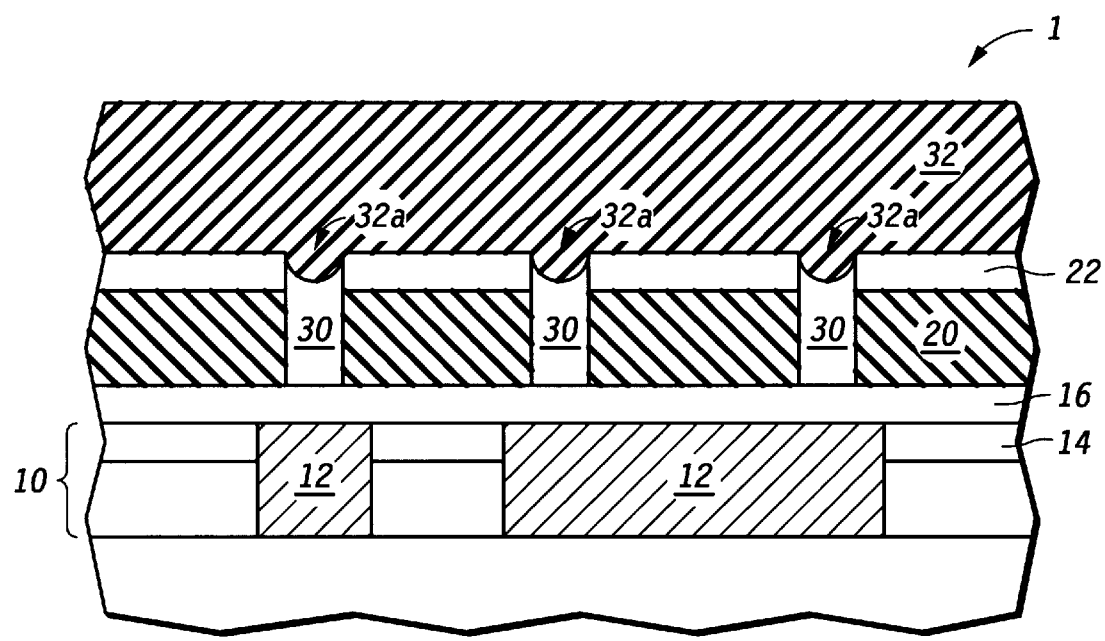
FIG. 5 depicts a step of forming a trench ILD layer, over the via ILD layer.

FIG. 4 represents the structure after exposure and development of the photoresist layer 24, followed by etching of first hard mask 22 and via ILD layer 20, to form vias 30. The photoresist layer 24 is not shown in FIG. 4, since the photoresist is consumed during etching. Unlike single in-laid processes, no metal fill is incorporated at this stage, but rather, further processing steps are carried out. In particular, turning to FIG. 5, a second dielectric layer, trench ILD layer 32 is deposited on the via ILD layer 20, after etching thereof. As shown in FIG. 5, vias 30 are partially filled by partial fill portions 32a of trench interlevel dielectric (ILD) layer 32. While partial fill portions 32a are depicted in FIG. 5, the extent of such portions is preferably minimized, to simplify material removal during later stages. Like the via ILD layer 20, the trench ILD layer 32 is preferably on the order 1,000 to 20,000 angstoms in thickness, more preferably on the order of 5,000–12,000 angstroms in thickness, and is formed of similar materials.

Figure 6:
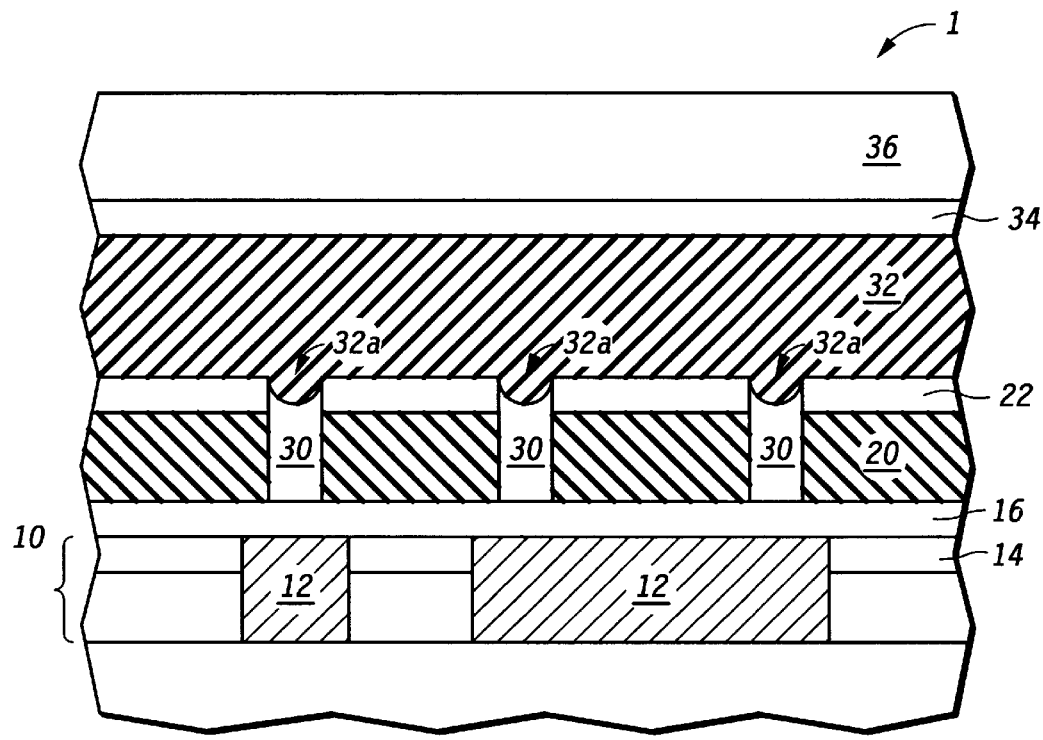
FIG. 6 depicts a step of forming a second mask, including a second hard mask and second photoresist layer, on the trench ILD layer.
Figure 7:
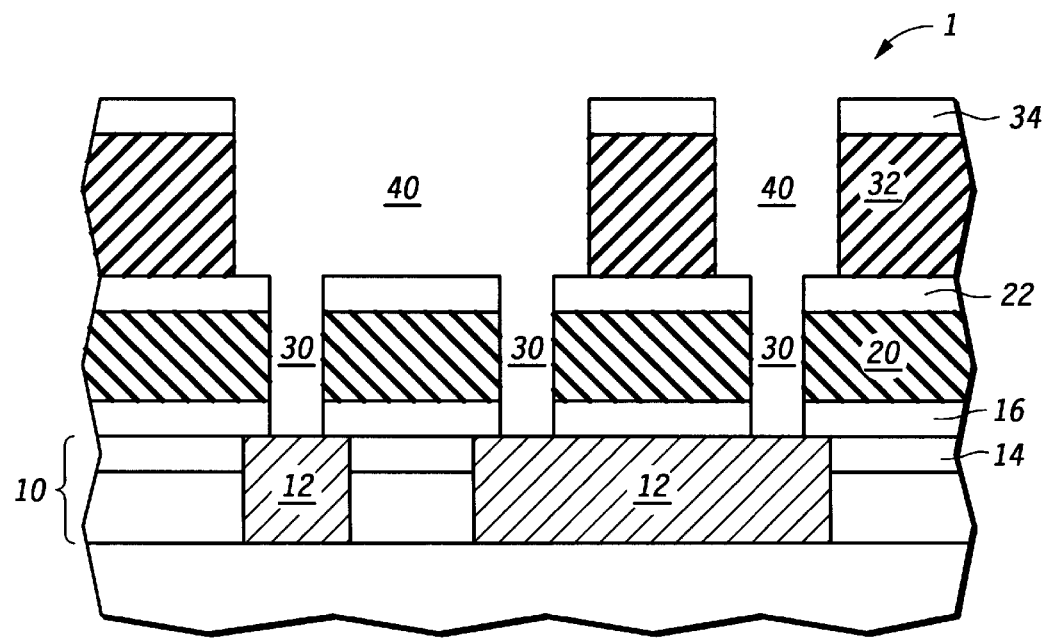
FIG. 7 depicts a step of etching trenches in the trench level ILD, the trenches being contiguous with the vias.
Figure 8:
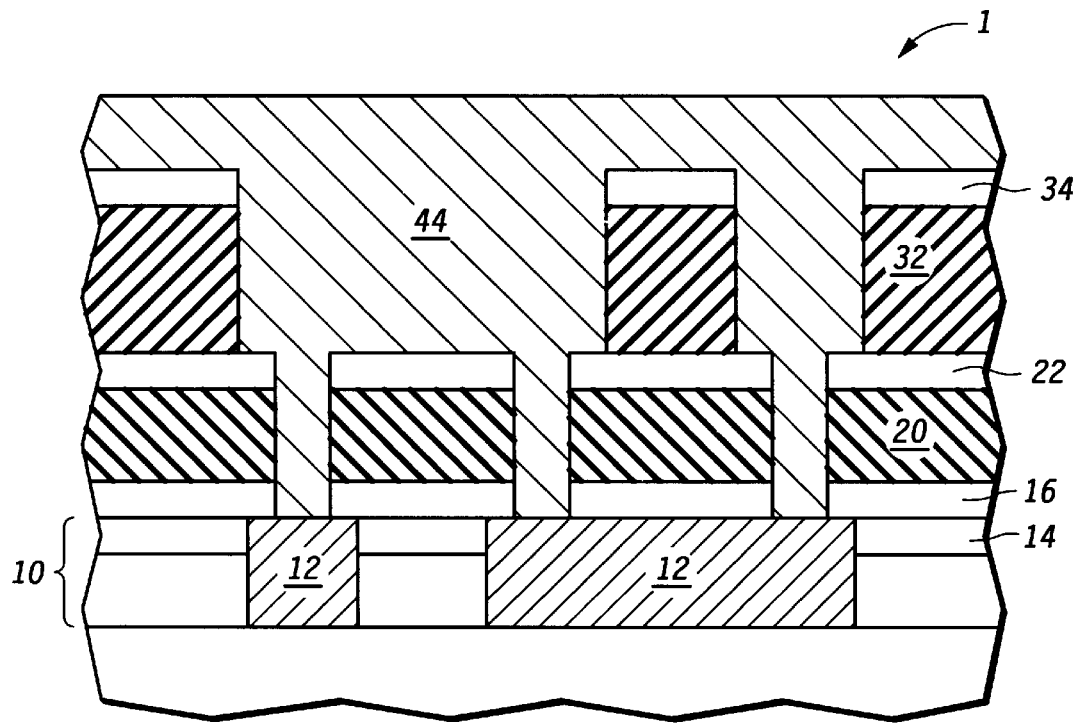
FIG. 8 depicts a step of filling metal to form a multilevel metal (MLM) interconnect structure.
Figure 9:
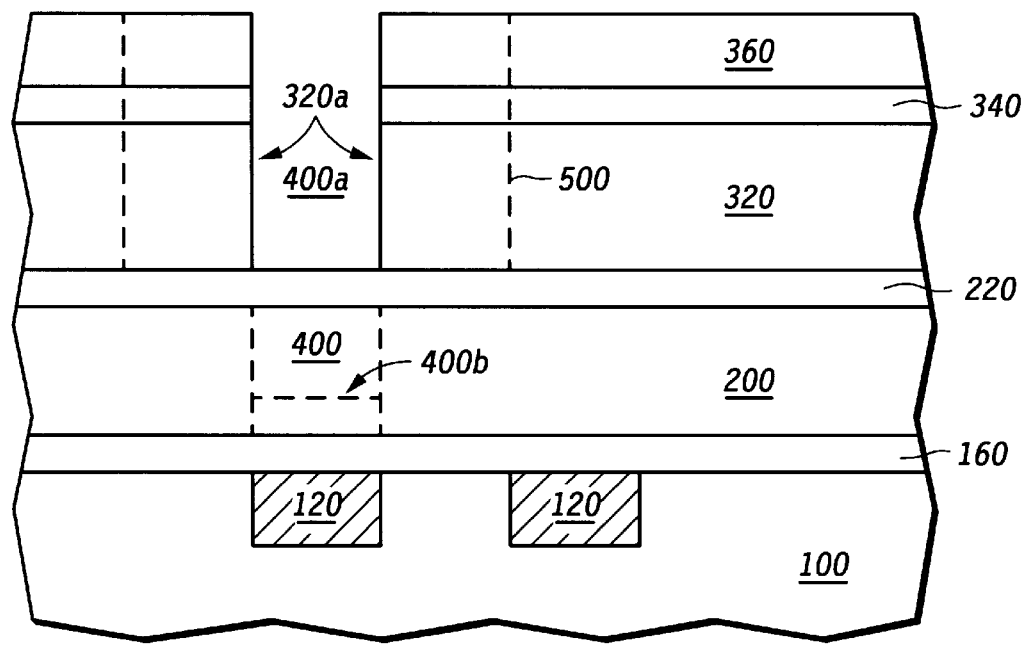
FIG. 9 depicts a prior art method of forming a dual in-laid multilevel metal interconnect structure.

In FIG. 6, a second hard mask 34 and a second photoresist layer 36 are deposited on trench ILD layer 32, in a similar fashion to first hard mask 22 and first photoresist layer 24. Thereafter, photoresist layer 36 is exposed and developed, and several etching steps are carried out to form trenches 40. Particularly, after exposure and development of second photoresist layer 36, a first etching step is carried out to remove desired portions of second hard mask 34, followed by a second etching step to remove desired portions of trench ILD layer 32, including partial fill portions 32a. Then, portions of passivating layer 16 are etched to expose metal interconnects 12. While three separate etching steps are described herein, it is well recognized in the art that the etching steps can be combined in a single process by switching between appropriate etchant gases.

Finally, a metal fill is deposited simultaneously in trenches 40 and vias 30, so as to make electrical contact with metal interconnects 12. As is known in the art, chemical mechanical polishing (CMP) is carried out to planarize the metal fill in trenches 40, and optionally remove those remaining portions of second hard mask 34.

Preferably, the metal fill 44 is formed of copper, which is deposited by an electroplating technique. However, other materials may be utilized, such as aluminum, gold, silver, and alloys thereof (including alloys containing copper). In the case of copper, preferably relatively thin barrier and metal seed layers are deposited along the topography of the structure. Particularly, a thin barrier layer formed of TaN, TiSiN, TaSiN, or other appropriate materials is deposited by IMP or CVD techniques, followed by a metal seed layer formed of copper, which may also be formed by IMP, CVD, or electroless plating techniques. The barrier layer prevents the copper from diffusing into the via ILD layer 20 and/or the trench ILD layer 32. The seed layer provides good electrical conduction for subsequent electroplating of the copper fill material.

As can be understood in reference to the foregoing explanation and the present drawings, a new process for forming a dual in-laid structure is provided that overcomes the deficiencies associated with prior art techniques. According to the present invention, materials such as low-k dielectrics that are reactive with photoresists and/or developers are not exposed during deposition of the photoresist or application of the developer. Accordingly, the present invention overcomes disadvantages associated with interaction between the photoresist and/or developer and the low-k dielectric material as discussed in connection with the conventional dual in-laid techniques.

Further, the present invention overcomes the disadvantages with the single in-laid techniques described above. Particularly, the present invention eliminates not only the requirement to deposit individually within the via and trench to form the multilevel metal interconnect, but also, eliminates the intermediate CMP processing step by requiring only one CMP processing step after depositing metal fill 44. Accordingly, throughput and yield are increased, while cycle time is decreased.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

What is claimed is:

1. A method for forming a semiconductor device comprising the steps of:
   providing a substrate having a metal interconnect;
   depositing a via interlevel dielectric layer over the substrate and the metal interconnect;
   etching the via interlevel dielectric layer to form a via over the metal interconnect;
   depositing a trench interlevel dielectric layer over the via interlevel dielectric layer and the via;
   etching the trench interlevel dielectric layer to form a trench, the trench being contiguous with the via; and
   depositing a metal so as to fill the via and the trench, and provide electrical connection with the metal interconnect.

2. The method of claim 1, wherein the via interlevel dielectric layer and the trench interlevel dielectric layer comprise a dielectric material having a dielectric constant less than 3.5.

3. The method of claim 2, wherein the dielectric material is selected from a group consisting of thermoplastics and thermosetting plastics.

4. The method of claim 3, wherein the dielectric material is a thermoplastic selected from a group consisting of polyimides, polyarylethers, PTFEs, polyquinolines, polyphenylquinoxalines, parylenes, and polynaphthalenes.

5. The method of claim 3, wherein the dielectric material is a thermosetting plastic selected from a group consisting of benzocyclobutenes, fluorinated amorphous carbons, and polyimides.

6. The method of claim 1, wherein the metal comprises a material selected from a group consisting of copper, aluminum, gold, and silver.

7. The method of claim 1, further comprising a step of depositing a first mask on the via interlevel dielectric layer prior to etching the via interlevel dielectric layer.

8. The method of claim 7, wherein the step of depositing the first mask comprises the steps of:
   depositing an inorganic layer over the via interlevel dielectric layer; and
   depositing a photoresist layer over the inorganic layer, wherein the photoresist layer is patterned to form the via.

9. The method of claim 8, wherein the inorganic layer comprises a material selected from a group consisting of silicon nitride, silicon oxynitride, silicon dioxide, phosphorous doped silicon dioxide, and composites thereof.

10. The method of claim 1, further comprising a step of depositing a second mask on the trench interlevel dielectric layer prior to the trench interlevel dielectric layer.

11. The method of claim 10, wherein the step of depositing the second mask comprises the steps of:
    depositing an inorganic layer over the trench interlevel dielectric layer; and
    depositing a photoresist layer over the inorganic layer, wherein the photoresist layer is patterned to form the trench.

12. The method of claim 11, wherein the inorganic layer comprises a material selected from a group consisting of silicon nitride, silicon oxynitride, silicon dioxide, phosphorous-doped silicon dioxide, composites thereof.

13. The method of claim 1, further comprising the step of depositing a passivation layer over the substrate before the step of depositing the via interlevel dielectric layer.

14. The method of claim 13, wherein the passivation layer comprises a material selected from a group consisting of silicon nitride, silicon oxynitride, and composites thereof.

15. A method for forming a semiconductor device comprising the steps of:
    providing a substrate having a metal interconnect;
    depositing a via interlevel dielectric layer comprising a dielectric material having a dielectric constant of less than 3.5 over the substrate and the metal interconnect;
    depositing a first inorganic layer over the via interlevel dielectric layer;
    depositing a first photoresist layer over the first inorganic layer;
    patterning the first photoresist layer;
    etching the first inorganic layer and the via interlevel dielectric layer using the first photoresist layer to form a via over the metal interconnect;
    depositing a trench interlevel dielectric layer comprising a dielectric material having a dielectric constant of less than 3.5 over the via interlevel dielectric layer and the via;

depositing a second inorganic layer over the trench interlevel dielectric layer;

depositing a second photoresist layer over the second inorganic layer;

patterning the second photoresist layer;

etching the second inorganic layer and the trench interlevel dielectric layer using the second photoresist layer to form a trench, the trench being contiguous with the via; and depositing a metal so as to fill the via and the trench, and provide electrical connection with the metal interconnect.

16. The method of claim 15, wherein the dielectric material is selected from a group consisting of thermoplastics and thermosetting plastics.

17. The method of claim 16, wherein the dielectric material is a thermoplastic selected from a group consisting of polyimides, polyarylethers, PTFEs, polyquinolines, polyphenylquinoxalines, parylenes, and polynaphthalenes.

18. The method of claim 16, wherein the dielectric material is a thermosetting plastic selected from a group consisting of benzocyclobutenes, fluorinated amorphous carbons, and polyimides.

19. The method of claim 15, wherein the metal comprises a material selected from a group consisting of copper, aluminum, gold, and silver.

20. The method of claim 15, wherein the first and second inorganic layers comprise a material selected from a group consisting of silicon nitride, silicon oxynitride, silicon dioxide, phosphorous-doped silicon dioxide, and composites thereof.

21. The method of claim 15, further comprising the step of depositing a passivation layer over the substrate before the step of depositing the via interlevel dielectric layer.

22. The method of claim 21, wherein the passivation layer comprises a material selected from a group consisting of silicon nitride, silicon oxynitride, or composites thereof.

23. The method of claim 15, further comprising the step of depositing a barrier layer within the trench and via prior to the step of depositing the metal.

24. The method of claim 23, further comprising the step of depositing a metal seed layer over the barrier layer before the step of depositing the metal.

25. The method of claim 24, wherein the step of depositing the metal comprises electroplating the metal on the metal seed layer.

26. The method of claim 15, wherein the step of depositing the metal is performed using chemical vapor deposition.

* * * * *